(12) United States Patent
Schicht et al.

(10) Patent No.: US 10,592,367 B2
(45) Date of Patent: Mar. 17, 2020

(54) REDUNDANCY IMPLEMENTATION USING BYTEWISE SHIFTING

(71) Applicant: Apple Inc., Cupertino, CA (US)

(72) Inventors: Steven Frederick Schicht, Austin, TX (US); William R. Weier, Austin, TX (US)

(73) Assignee: Apple Inc., Cupertino, CA (US)

( * ) Notice: Subject to any disclaimer, the term of this patent is extended or adjusted under 35 U.S.C. 154(b) by 160 days.

(21) Appl. No.: 15/939,089

(22) Filed: Mar. 28, 2018

(65) Prior Publication Data

US 2019/0087291 A1 Mar. 21, 2019

Related U.S. Application Data

(60) Provisional application No. 62/559,351, filed on Sep. 15, 2017.

(51) Int. Cl.
| | |
|---|---|
| *G06F 11/00* | (2006.01) |
| *G06F 11/20* | (2006.01) |
| *G06F 3/06* | (2006.01) |
| *G11C 7/10* | (2006.01) |
| *G11C 29/00* | (2006.01) |
| *G11C 11/419* | (2006.01) |
| *G11C 29/12* | (2006.01) |

(52) U.S. Cl.
CPC ........ *G06F 11/2094* (2013.01); *G06F 3/0619* (2013.01); *G06F 3/0646* (2013.01); *G06F 3/0659* (2013.01); *G06F 3/0683* (2013.01); *G11C 7/1009* (2013.01); *G11C 29/76* (2013.01); *G06F 2201/82* (2013.01); *G11C 11/419* (2013.01); *G11C 2029/1204* (2013.01)

(58) Field of Classification Search
CPC .............................. G06F 11/08; G06F 11/076
See application file for complete search history.

(56) References Cited

U.S. PATENT DOCUMENTS

| | | | | | |
|---|---|---|---|---|---|
| 4,710,934 | A | * | 12/1987 | Traynor | .............. G06F 11/1076 714/765 |
| 5,163,023 | A | * | 11/1992 | Ferris | ................... G11C 29/848 365/189.02 |
| 5,548,553 | A | * | 8/1996 | Cooper | .................. G11C 29/80 365/189.02 |
| 6,671,219 | B1 | * | 12/2003 | Shimazaki | .............. G06F 12/02 365/230.06 |

(Continued)

*Primary Examiner* — Christopher S McCarthy
(74) *Attorney, Agent, or Firm* — Kowert Hood Munyon Rankin and Goetzel PC; Rory D. Rankin

(57) ABSTRACT

Systems, apparatuses, and methods for efficiently increasing reliability of memory accesses are described. In various embodiments, write data and write mask data are shifted by redundancy logic in a memory. The redundancy logic receives write data bits, which are segmented into one or more write groups in addition to one or more mask bits and one or more shift bits per write group. If the redundancy logic detects a first shift bit assigned to a first write group is asserted, then the redundancy logic selects a second mask bit assigned to a second write group different from the first write group. Otherwise, a first mask bit assigned to the first write group is selected. Following, the redundancy logic combines the selected mask bit with the first data bit of the first write group.

20 Claims, 7 Drawing Sheets

(56) References Cited

U.S. PATENT DOCUMENTS

| | | | |
|---|---|---|---|
| 2001/0028584 A1* | 10/2001 | Nakayama | G11C 29/24 365/203 |
| 2004/0076042 A1* | 4/2004 | Wu | G11C 29/848 365/200 |
| 2009/0067270 A1* | 3/2009 | Wissel | G11C 29/846 365/200 |
| 2011/0235447 A1* | 9/2011 | Hess | G11C 29/846 365/200 |
| 2015/0302939 A1* | 10/2015 | Hoekstra | G11C 29/44 365/200 |
| 2017/0249993 A1* | 8/2017 | Pelley | G11C 15/04 |

* cited by examiner

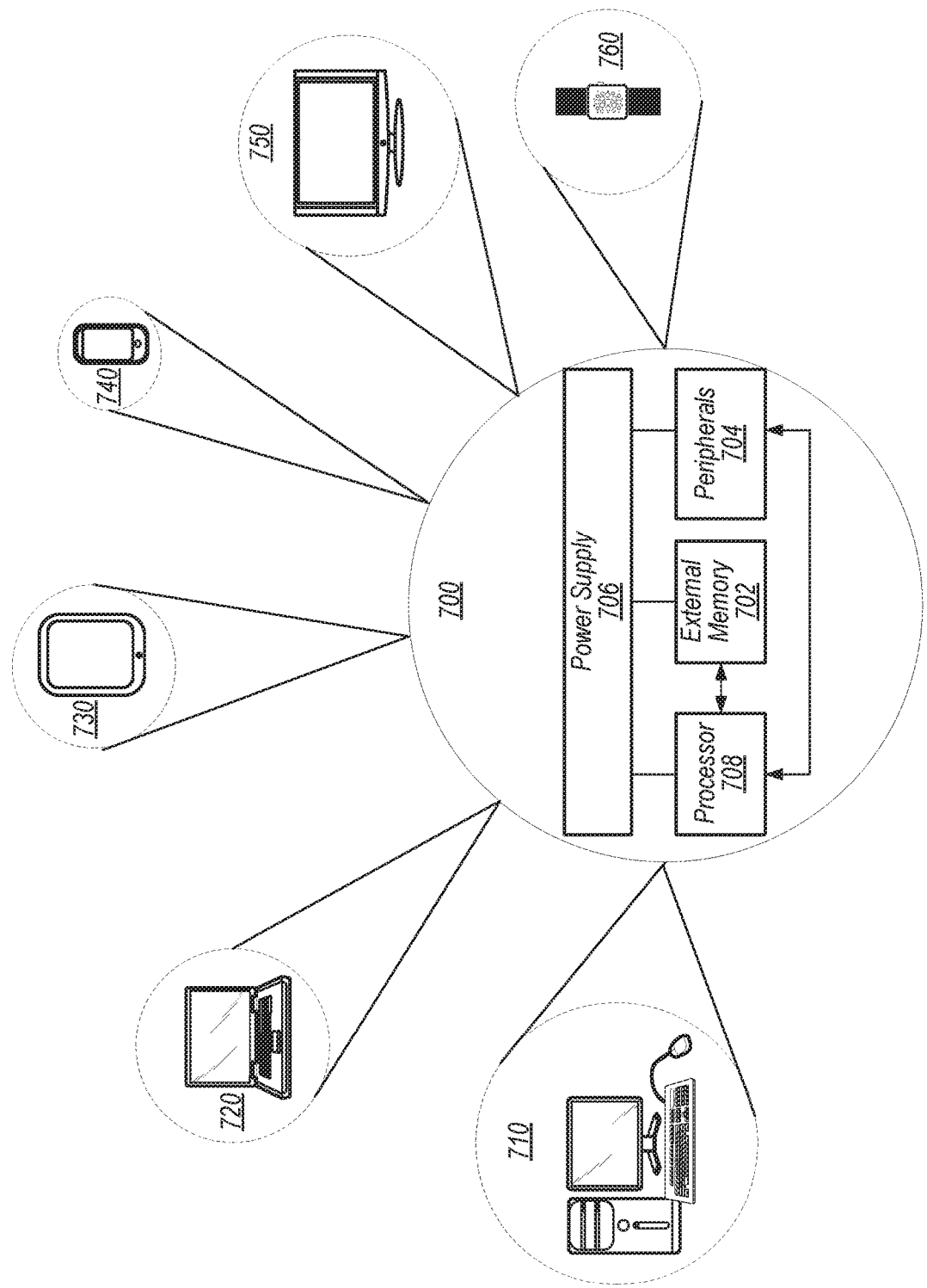

REDUNDANCY IMPLEMENTATION USING BYTEWISE SHIFTING

CROSS REFERENCE TO RELATED APPLICATIONS

This application claims priority to Provisional Patent Application Ser. No. 62/559,351 entitled "Redundancy Implementation Using Bytewise Shifting," filed Sep. 15, 2017, the entirety of which is incorporated herein by reference.

BACKGROUND

Technical Field

Embodiments described herein relate to the field of computing systems and, more particularly, to efficiently increasing reliability of memory accesses.

Description of the Related Art

Generally speaking, a variety of computing systems include one or more processors and a memory, and the processors generate access requests for instructions and application data while processing one or more software applications. The one or more processors may include a central processing unit (CPU), data parallel processors like graphics processing units (GPUs), digital signal processors (DSPs), and so forth. When fetching instructions and data, the processors check a hierarchy of local cache memories. Static random access memory (SRAM) is commonly used for the memory.

The SRAM includes an array of many bit cells and a logic portion used for accessing values stored in the array. At times, the number of software applications simultaneously running on the computing system reaches an appreciable number. Therefore, the amount of instructions and data being used for processing the multiple software applications appreciably grows. Larger memory arrays provide a larger number of bit cells for storing the amount of data and instructions processed by the one or more processors. However, the on-die floorplan, especially for mobile devices, has limited area for the memory arrays. In addition, design requirements for power consumption and noise sensitivity limit the number of bit cells.

Advances in semiconductor fabrication techniques have been reducing transistor dimensions in order to increase both performance and functionality within the same amount of space. Variations in semiconductor fabrication processes create differences between designed transistors and fabricated transistors within a single semiconductor die, between semiconductor dies on a single wafer, and between different wafers. The variations may create variable transistor behavior in addition to transistor failures. The SRAM bit cell includes multiple transistors. Therefore, as the memory array sizes increase while the dimensions of the transistors decrease, the probability of a given memory array having a faulty bit cell increases.

In view of the above, methods and mechanisms for efficiently increasing reliability of memory accesses are desired.

SUMMARY

Systems and methods for efficiently increasing reliability of memory accesses are contemplated. In various embodiments, a computing system includes at least one processor and a memory. In some embodiments, the memory is one level of a multi-level cache hierarchy, and each one of the memory bit cells is a copied variation of a static random access memory (SRAM) cell. In various embodiments, the memory includes one or more arrays, read columns, write columns, level-shifting logic, and latches for read data, write data and write mask data. Row decoders select the memory line to be accessed based on the received request address. Write data is driven from block into array and written into a portion of the selected row. The portion is selected by column decoders.

In various embodiments, the memory also includes redundant memory cells arranged in columns in a given memory array. One or more of the redundant columns replace one or more columns in the array, which include failing bit cells. In order to replace a group of failing columns, the write data and the write mask data for the failing columns are shifted toward physically neighboring columns with no detected failing bit cells. The write data and write mask data for the last one or more columns being shifted away from the failing columns are connected to one or more of the redundant columns.

In an embodiment, redundancy logic is used to perform the above shifting of write data and write mask data. The redundancy logic receives write data bits, which are segmented into one or more write groups. The redundancy logic also receives one or more mask bits with each mask bit being assigned to a respective write group. The redundancy logic further receives one or more shift bits with each shift bit also being assigned to a respective write group. In various embodiments, the redundancy logic combines a first mask bit corresponding to a first write group with each data bit other than a first data bit of the first write group.

If the redundancy logic detects a first shift bit corresponding to the first write group is asserted, then the redundancy logic selects a second mask bit assigned to a second write group different from the first write group. However, if the redundancy logic detects the first shift bit is negated, then the redundancy logic selects the first mask bit. Following, the redundancy logic combines the selected mask bit with the first data bit of the first write group. Therefore, each of the mask bits is not needed to be shifted. Rather, a subset, which may be a single mask bit in some cases, of the write mask bits are shifted instead of all of the write mask bits in the write group. The subset is located at a most-significant end or a least significant end of the write group depending on the implementation. Shifting only the subset of write mask bits within a write group reduces routing and an amount of circuitry for the shifting, which also reduces the on-die area used for shifting write mask data within the redundancy logic.

BRIEF DESCRIPTION OF THE DRAWINGS

The above and further advantages of the methods and mechanisms may be better understood by referring to the following description in conjunction with the accompanying drawings, in which:

FIG. 7 is a block diagram of one embodiment of a system.

Figure 1:
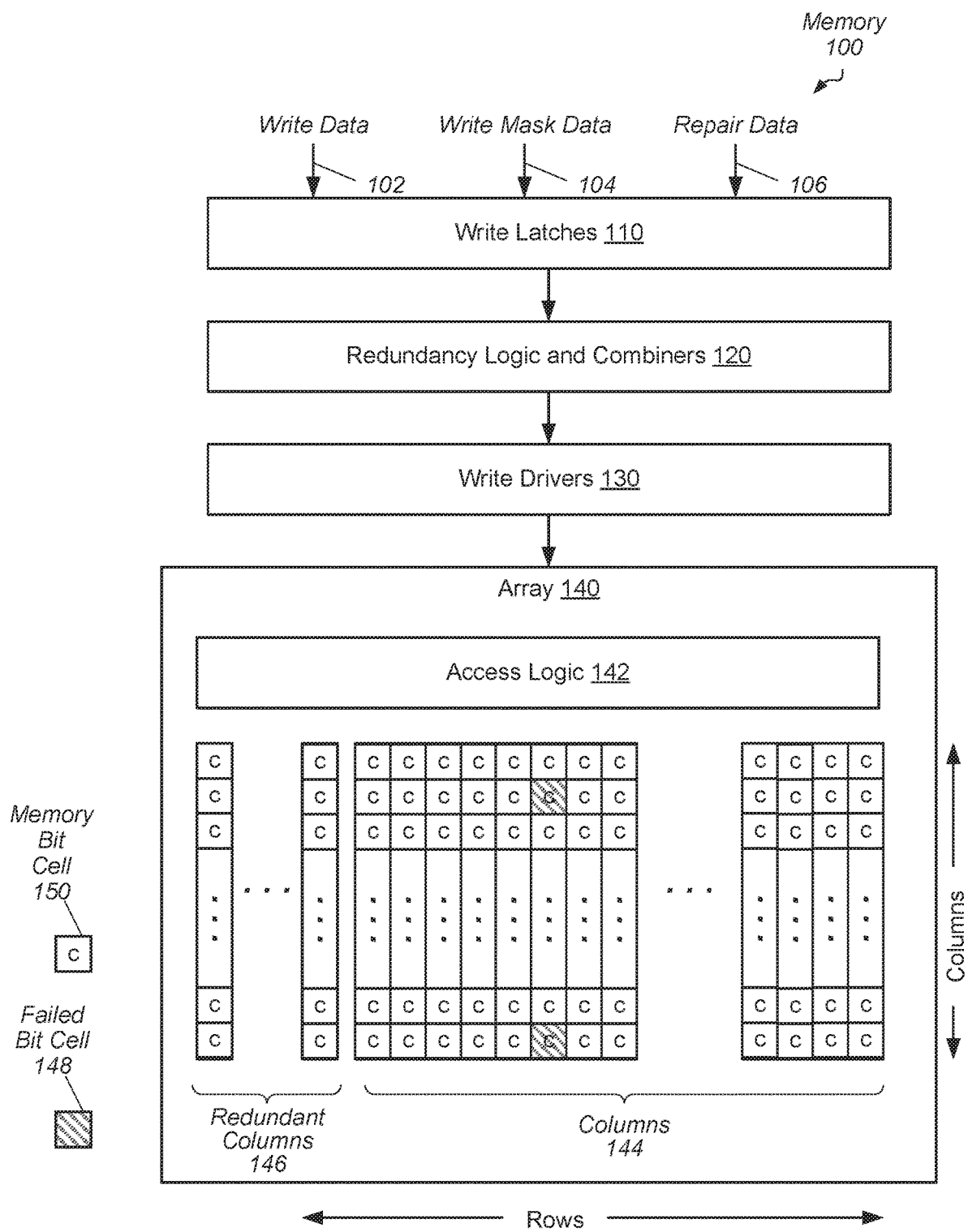
FIG. 1 is a block diagram of one embodiment of a memory.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112(f) for that unit/circuit/component.

DETAILED DESCRIPTION OF EMBODIMENTS

In the following description, numerous specific details are set forth to provide a thorough understanding of the embodiments described in this disclosure. However, one having ordinary skill in the art should recognize that the embodiments might be practiced without these specific details. In some instances, well-known circuits, structures, and techniques have not been shown in detail for ease of illustration and to avoid obscuring the description of the embodiments.

Turning to FIG. 1, a generalized block diagram illustrating one embodiment of memory 100 is shown. In the illustrated embodiment, memory array 140 has multiple memory bit cells 150 arranged in a tiled format. In some embodiments, each one of the memory bit cells is a copied variation of a six-transistor static random access memory (SRAM) cell selected based on design needs. In other embodiments, another one of various types of SRAM cells is selected. For write operations, memory 100 uses write latches 110, redundancy logic and combiners 120 and write drivers 130.

A write operation for array 140 includes incoming write information 102-106, which is stored by sequential elements in block 110. The sequential elements may include one or more of latches, registers and flip-flops. The write data 102 may include two or more write groups. A write group is two or more bits of write data sharing a same write enable. As used herein, a write mask bit is equivalent to a write enable signal. In some embodiments, a write group is a byte of data. Therefore, the write mask data 104 includes a write mask bit for each byte of write data 102. However, in other embodiments, write groups of other data sizes may be used. In some embodiments, when a write mask bit has a Boolean logic high level, the write mask bit is used to disable a write operation for an assigned write group. In other embodiments, the Boolean logic high level for the write mask bit is used to enable a write operation for an assigned write group. As used herein, a Boolean logic high level is also referred to as a logic high level. Similarly, a Boolean logic low level is also referred to as a logic low level.

The write data 102 and write mask data 104 are combined by combiners in block 120. In an embodiment, the selection of which portions of write data to combine with which portions of write mask data is based on the repair data 106 and redundancy logic in block 120. In various embodiments, the combine logic in block 120 operates on a bit-wise basis to enable or disable (mask) the bit from being written. The output values of the combiners are sent to the write drivers 130, which send enabled write information to be written into array 140.

Access logic 142 selects which columns of columns 144 and redundant columns 146 to write data based on information received from the write drivers 130. Array 140 may use one or more redundant columns 146. The redundant columns 146 are used when one or more memory bit cells of a column of columns 144 fail. As shown, two memory bit cells are failed memory bit cells 148. Therefore, one of the redundant columns 146 is used to replace the column with failed memory bit cells 148. The failed memory bit cells 148 may be detected during testing of a semiconductor device. The repair data 106 may be updated by logic (not shown) implemented in hardware, software or a combination when a failure is detected in array 140.

The repair data 106 may indicate which column of columns 144 has one or more failed memory bit cells 148. Therefore, based on the repair data 106, the redundancy logic in block 120 may shift the write data 102 for each column between the failed column and the redundant column toward the redundant column. In order to maintain mask and write data consistency, the redundancy logic in block 120 may replace write mask data only at write group boundaries. For example, for columns between the failed column and the redundant column, the write mask bit at one end of the write group is replaced by a write mask bit assigned to an immediately adjacent neighbor write group. The remaining bit positions of the write group continue to use the assigned write mask bit for the write group. Therefore, the write mask bits are not shifted for each bit position for columns between the failed column and the redundant column. The lack of extra shifting reduces signal routing and on-die area consumed by control and shifting logic.

Figure 2:
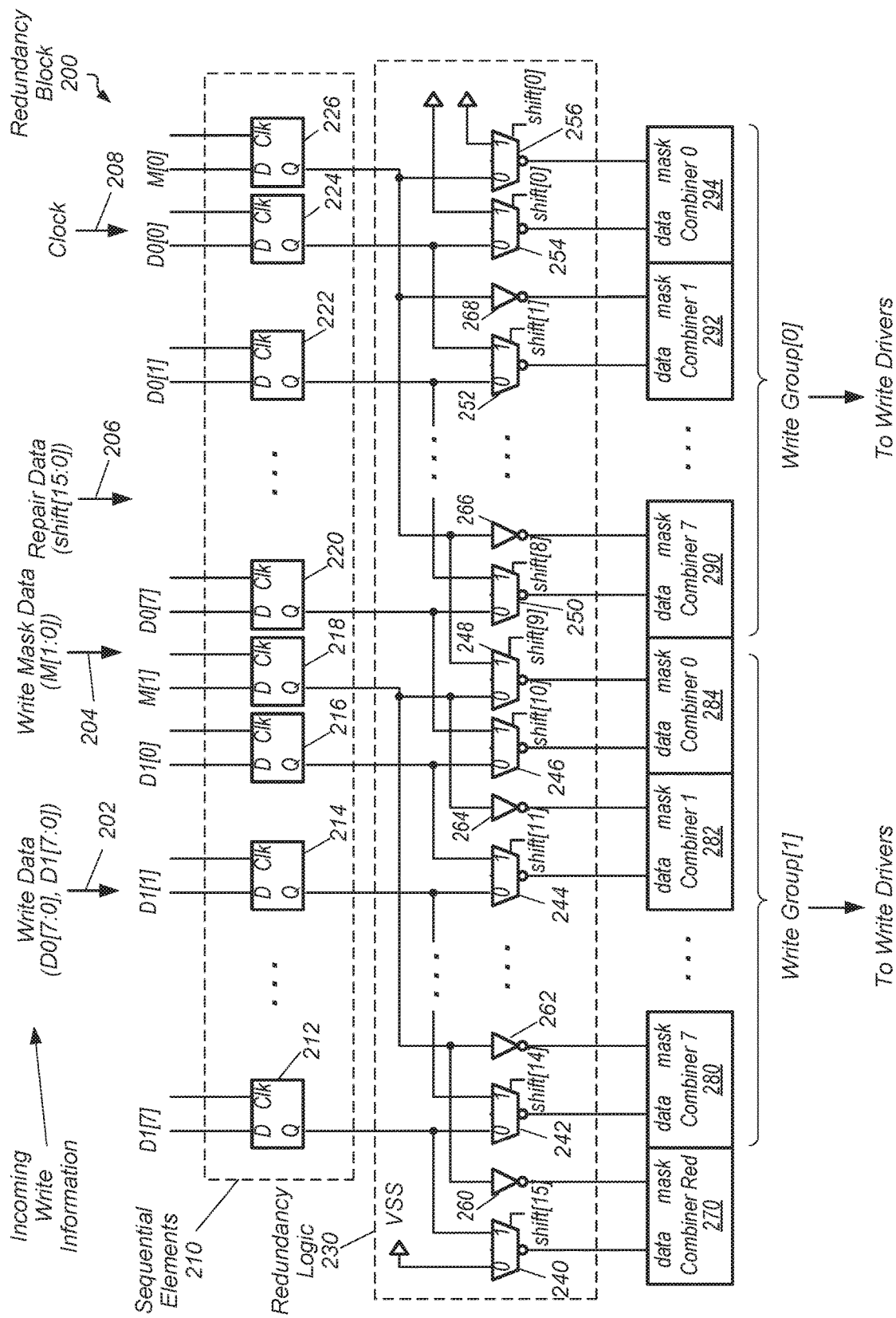
FIG. 2 is a block diagram of one embodiment of a redundancy block for a memory.

Turning to FIG. 2, a generalized block diagram illustrating one embodiment of a redundancy block 200 for a memory is shown. In the illustrated embodiment, a write operation for a memory array includes incoming write information 202-208, which is stored by sequential elements 210. Some of the incoming information 202-208 is combined by combiners 270-294. In various embodiments, the combine logic within the combiners 270-294 includes Boolean AND logic at a bit-wide basis. Selecting which portions of incoming information is combined with other portions of the incoming information is handled by the redundancy logic 230. As shown, the incoming write information includes write data 202, write mask data 204, repair data 206 and a clock signal 208. The output values of the combiners 270-294 are sent to write drivers. The write drivers (not shown) send enabled write information to be written into the memory array.

In the illustrated embodiment, the write data includes data for two bytes to be written into an array. Although two bytes are shown in the example, any other amount of write data is possible and contemplated. The two bytes of write data in the example include D1[7:0] and D0[7:0]. The write mask data 204 is used to enable a write operation for a particular write group. As described earlier, a write group is one or more bits of write data sharing a same write enable. As used herein, a write mask bit is equivalent to a write enable signal. In the illustrated embodiment, a write group is a byte of data. However, in other embodiments, write groups of other data sizes may be used.

As shown, the write mask data 204 includes a write enable bit for each write group, or byte in the illustrated embodiment. The write mask data 204 includes the bits M[1:0]. The mask bit M[1] enables or disables a write operation for each of the eight bits in the byte D1[7:0]. Similarly, the mask bit M[0] enables or disables a write operation for each of the eight bits in the byte D0[7:0]. For example, some applications update relatively small portions of data, such as at a byte granularity, rather than large contiguous segments. Video graphics processing applications typically update at a relatively small granularity for lighting, shading and other operations. However, write groups may be of any size and a byte is used here as one example.

The repair data 206 indicates whether a redundant column in the memory array is being used for data storage and data access. Memory arrays, especially embedded static random access memory (SRAM), have multiple memory bit cells arranged in a tiled format. In some embodiments, each one of the memory bit cells is a copied variation of a six-transistor RAM cell selected based on design needs. In other embodiments, another one of various types of RAM cells or another type of memory elements or cells is selected. Without one or more redundant rows or redundant columns, if any one of the memory bit cells fails, the entire memory array is no longer trusted to provide correct information for data accesses. In one embodiment, the memory array is manufactured with an extra column, which is referred to as a redundant column. Should one or more memory bit cells fail in a column, the redundant column replaces the failed column during operation.

In one embodiment, if a memory array provides data access for 64 bits (e.g., D[63:0]), then the memory array may be manufactured with 65 columns rather than 64 columns. In one embodiment, the redundant column may be placed at the most significant position of the data such as at D[64] if the highest numbered bit indicates the most significant bit. If one or more memory bit cells fail in the 19$^{th}$ column (D[18]), then data accesses may be shifted. In an embodiment, the write data is shifted at a granularity of a bit. For example, write data for D[63:18] are shifted one bit position to be written into columns corresponding to D[64:19]. Write data for D[17:0] are not shifted and continue to be written into columns corresponding to D[17:0].

Indicators, such as repair data 206, may be used to indicate a memory failure has been detected in one of the memory array columns. In various embodiments, a decoder generates the indicators that specify which columns shift write data 202. The repair data 206 includes an indication of a data shift for each write group, or byte in the illustrated embodiment. As shown in FIG. 2, the repair data, shift[15:0] 206, determines the column repair location where bits will be shifted from the failing column to an adjacent passing column. For example, the bit shift[0] indicates whether the bit D0[0] is shifted. Similarly, the bit shift[1] indicates whether the bit D0[1] is shifted, and so on. As shown, in some embodiments, at least the write data 202 and the write mask data 204 are received by sequential elements 210. In some embodiments, sequential elements 210 are pipeline staging sequential elements. In the illustrated embodiment, sequential elements 210 includes at least sequential elements 212-226 for receiving and storing write data 202 and write mask data 204. In some embodiments, sequential elements 212-226 are flip-flop circuits. In other embodiments, sequential elements 212-226 are latch circuits, or non-storage asynchronous inputs.

As shown, in one embodiment, redundancy logic 230 includes multiplexers 240-256 for shifting write data for columns between the failed column and the redundant column toward the redundant column. During repair, instead of shifting the write mask data at the same granularity of a bit, only the write mask bit at one end of the write group is potentially replaced. As shown, multiplexer 248 is configured to replace a write mask data bit with a write mask data bit assigned to a neighboring write group. In an embodiment, the neighboring write group is an immediately adjacent write group. The other write mask bits are routed directly from sequential elements 210 to combiners 270-294. In an embodiment, an inverter is used for the direct routing to adjust the logic level of the write mask bits. For example, inverters 260-268 are used. These remaining write mask bits in the write groups are not sent to selection logic for potential shifting. Therefore, the write mask bit that is stored in sequential element 218 is replicated to create multiple mask bits for write group[1]. As shown, each write bit (e.g., bit positions 1 to 7) other than the write bit at bit position 0 in write group[1] is assigned the value of the write bit at bit position 0 and this value is received from sequential element 218, regardless of whether or not it is determined there is a failed column in the array. In the illustrated embodiment, the subset of mask bits capable of being replaced with a write mask bit assigned to a neighboring write group is a single mask bit. In this case, the single mask bit is the mask bit at bit position 0. In other embodiments, the subset of mask bits capable of being replaced with a write mask bit assigned to a neighboring write group is two or more, but not all, mask bits in write group[1].

Figure 3:
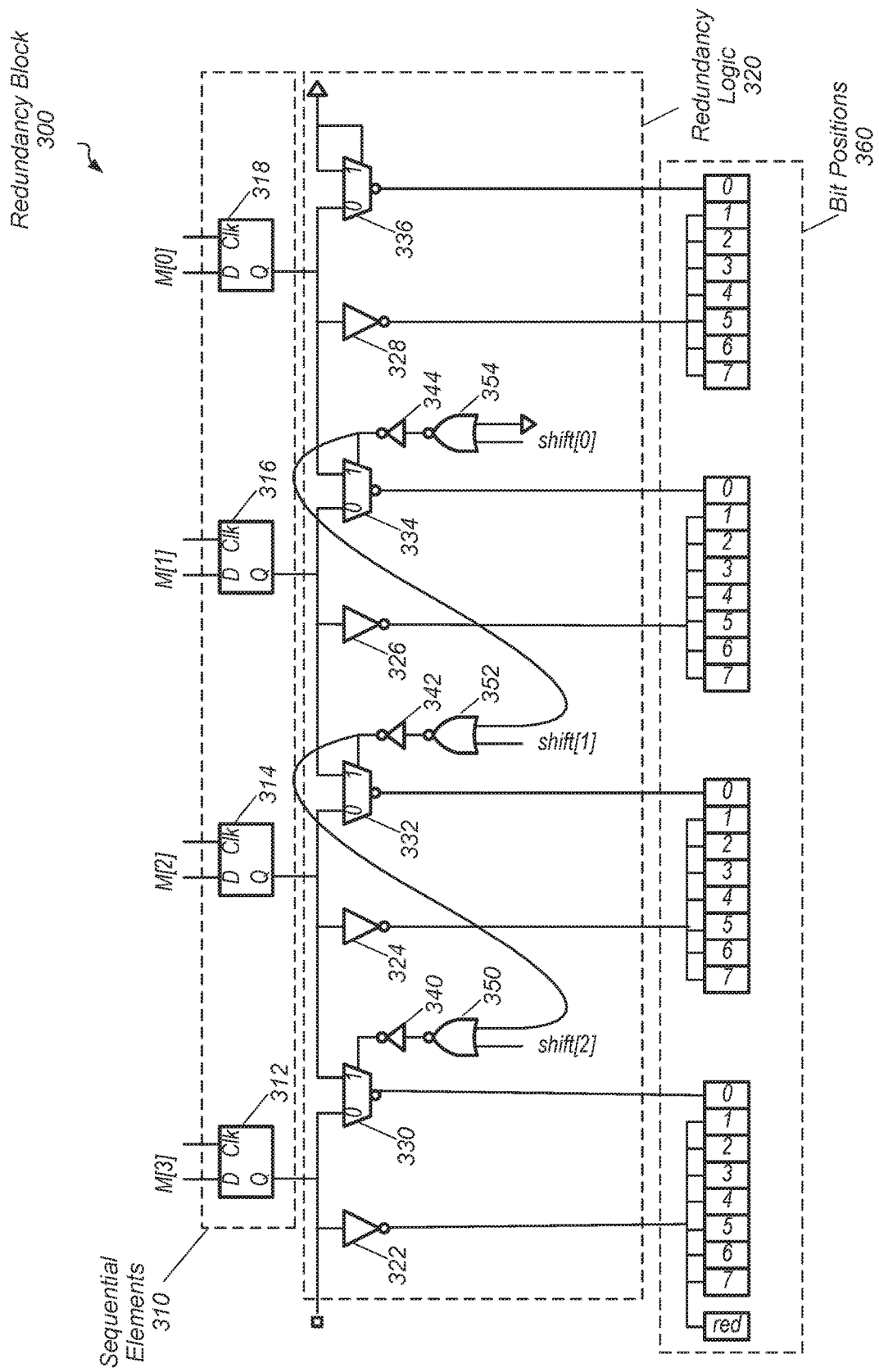
FIG. 3 is a block diagram of one embodiment of a redundancy block adjusting write mask data for a memory.

Turning to FIG. 3, a generalized block diagram illustrating one embodiment of a redundancy block 300 adjusting write mask data for a memory is shown. As shown, redundancy block 300 includes sequential elements 310 and redundancy logic 320 for adjusting write mask data. In the illustrated embodiment, write mask data M[3:0] is received by sequential elements 310. The write data is not shown for ease of illustration. In the illustrated embodiment, sequential elements 310 includes at least sequential elements 312-318 for receiving and storing write mask data M[3:0] In some embodiments, sequential elements 312-318 are flip-flop circuits, whereas in other embodiments, sequential elements 312-318 are latch circuits, or non-storage asynchronous inputs. Each one of the write mask bits in M[3:0] is assigned to a respective write group. In the illustrated embodiment, a write group is a byte. However, in other embodiments, another data size of one or more bits may be selected for the write group size. Bit positions 360 show the bit positions of the write groups.

Redundancy logic 320 receives both the outputs from the sequential elements 310 and repair data such as shift[2:0]. In some embodiments, an external decoder generates the values for shift[2:0] based on a detected failed column. As shown, redundancy logic 320 may replace only one write mask bit within a given write group. The remaining write mask bits within a write group receive the values from the sequential elements 320. For example, inverters 322-328 convey the outputs of the sequential elements 320 to bit positions [1:7] of corresponding write groups. As shown, inverter 322 also sends the output of sequential element 312 to the redundant bit position.

Each of the multiplexers 330-336 selects the mask data to send to the bit position 0 of each of the write groups. For example, each of the multiplexers 330-336 selects between the mask data assigned to the write group and the mask data assigned to a different write group. As shown, the select lines of the multiplexers 330-336 receive the output of the Boolean OR logic implemented by the Boolean NOR gates 350-354 and the inverters 340-344. In one example, the select line of multiplexer 330 receives the output of the combination of inverter 340 and the Boolean NOR gate 350. The Boolean NOR gate 350 receives two inputs such as the input shift[2] and the output of the combination of the inverter 342 and the Boolean NOR gate 352.

If the output of the combination of inverter 340 and the Boolean NOR gate 350 is a logic high level, then multiplexer 330 selects the mask bit from a different write group such as the physically neighboring write group. Otherwise, if the output of the combination of inverter 340 and the Boolean NOR gate 350 is a logic low level, then multiplexer 330 selects the mask bit assigned to its write group. In some embodiments, a redundant column in an array is placed next to columns of the array corresponding to a most significant write group of the multiple write groups. In such cases, the data bit, such as bit position 0 in the illustrated embodiment, is a least significant bit of the write groups. The different write group providing a mask bit to the multiplexers 330-336 is both a write group including the corresponding multiplexer of the multiplexers 330-336 and a less significant write group than the write group including the corresponding multiplexer. In other embodiments, the reverse scenario is used.

Figure 4:
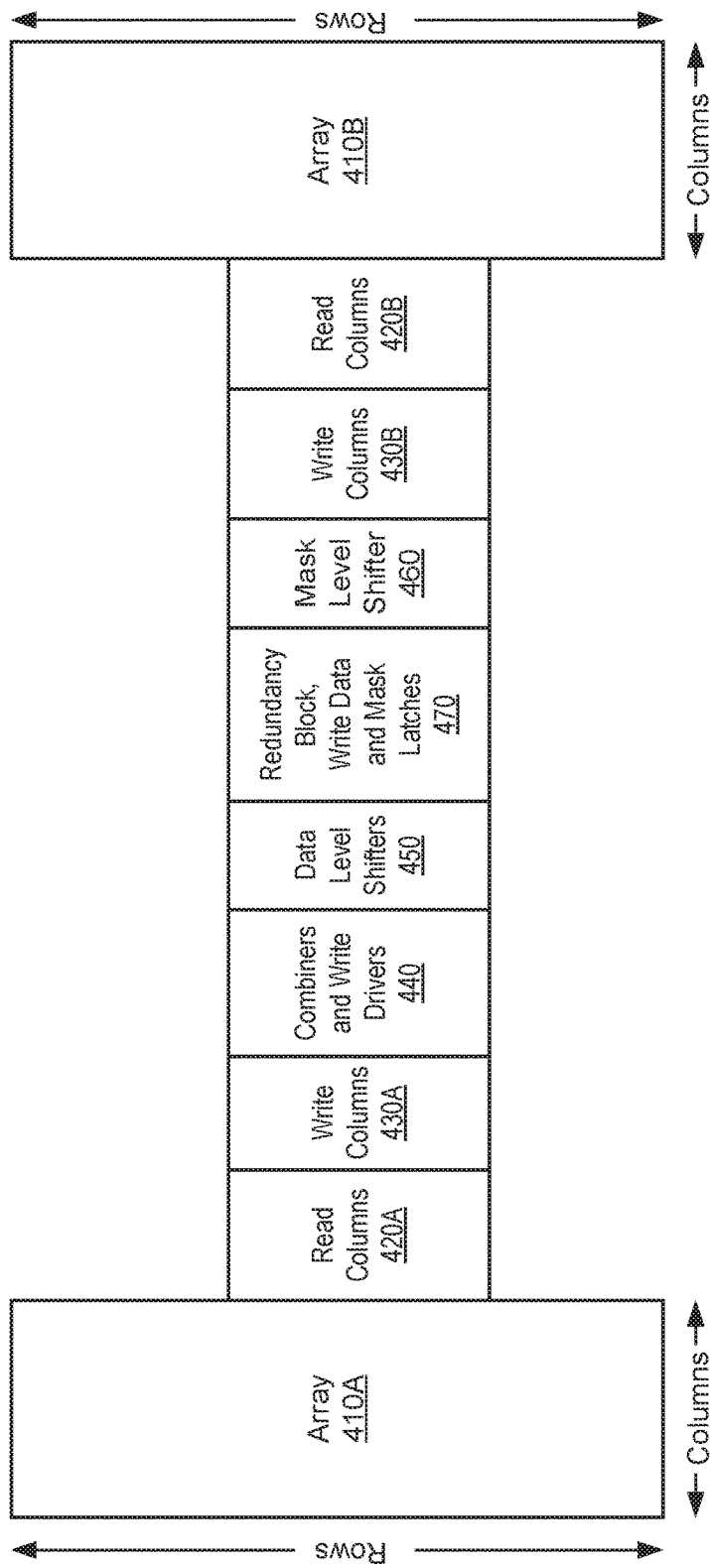
FIG. 4 is a block diagram of another embodiment of a memory.

Turning to FIG. 4, a generalized block diagram illustrating another embodiment of memory 400 is shown. In various embodiments, memory 400 comprises arrays 410A-410B, read columns 420A-420B, write columns 430A-430B, write drivers 440, data level shifters 450, mask level shifters 460 and latches 470 for write data and write mask data. The routing of received memory access requests and received control signals are not shown for ease of illustration. Similar to the memory arrays described earlier, in various embodiments, each of the arrays 410A-410B includes multiple memory bit cells arranged in a tiled format. In various embodiments, each one of the memory bit cells is a copied variation of an SRAM cell.

As shown, rows are placed in a vertical orientation in arrays 410A-410B and columns are placed in a horizontal orientation. However, the orientation of rows and columns may be switched in other embodiments. Rows may also be referred to as entries. In various embodiments, each row, or entry, stores data such as one or more memory lines. In addition, the orientation of blocks 420A-420B, 430A-430B and 440-470 may also be placed in a different orientation and/or a different location with respect to one another and with respect to arrays 410A-410B. In various embodiments, each of the blocks 420A-420B, 430A-430B and 440-470 is communicatively coupled to another one of the blocks. For example, direct connections are used wherein routing occurs through another block. Alternatively, staging of signals is done in an intermediate block.

In some embodiments, a row within the arrays 410A-410B is wider than input/output (I/O) data, which is received by memory 400 and sent by memory 400. For example, in one embodiment, a row within the arrays 410A-410B includes 256 bits, whereas the width of I/O data is 64 bits. Therefore, the arrays 410A-410B use a four-to-one selection logic, such as multiplexers, to access the correct portion of the 256-bit row. Write operations may target a finer granularity of data. In one embodiment, write operations are capable of targeting a single byte of data. Therefore, a write mask is used to specify which byte(s) of the eight bytes in the 64-bit I/O data are enabled for the write operation. Latches 470 receive the write data and the write mask data.

In various embodiments, memories use multiple supply voltage domains to achieve both performance for memory accesses and lower power consumption for transferring data and control signals over relatively long distances. In an embodiment, memory 400 is a dual supply rail memory, which converts data and control signals using a first supply voltage to values using a second supply voltage greater than the first supply voltage. Blocks 450 and 460 convert (level shift) at least the write data and the write mask data from the first supply voltage to the second supply voltage. In an embodiment, arrays 410A-410B and blocks 420A-420B, 430A-430B and 440 utilize the second supply voltage. A portion of the blocks 450 and 460 also use the second supply voltage. Block 470 receives the write data and the write mask data. Block 470 stores the received data in storage elements such as latches, registers or flip-flops. The stored data are sent from block 470 to the level shifters in blocks 450 and 460.

In an embodiment, redundancy logic is located in block 470, and write data and write mask data are shifted to another column before being level shifted by blocks 450 and 460. In other embodiments, the redundancy logic is located in another block. In some embodiments, block 440 receives an indication whether the I/O data is in a repair mode. The indication may specify which column of the I/O data is a failed column. For example, if the I/O data has a width of 64 bits, then the indication may specify the $19^{th}$ column is a failed column. In some embodiments, the indication is generated by test circuitry, test software or a combination of test hardware and software. In various embodiments, block 440 includes redundancy logic for selecting which portions of incoming information is combined with other portions of the incoming information. For example, the redundancy logic selects which portions of write data are combined with portions of write mask data based on the indication of the repair mode.

In various embodiments, block 440 uses redundancy logic such as the logic within redundancy block 200 (of FIG. 2) and redundancy block 300 (of FIG. 3). Therefore, repair shifting uses less circuitry and signal routing compared to repair shifting with a bitwise mask. The size of a write group may be two bits, a nibble (four bits), a byte (eight bits), or other size based on design choice. Within a write group, a multiplexer or other selection logic is used only for a single bit position of the write data. For example, the bit position at a beginning boundary or an ending boundary of the write group may be selected. In an embodiment, the selected boundary may be the most significant bit of the write group. In another embodiment, the selected boundary may be the least significant bit of the write group.

The selection logic selects either the write mask bit assigned to the write group or the write mask bit assigned to a neighbor write group. In various embodiments, the neighbor write group is an immediately adjacent write group. The selected write mask bit is later combined with the write data bit corresponding to the bit position of the write group. The remaining bit positions of the write group continue to use the assigned write mask bit with no selection performed. The assigned write mask bit assigned to the write group is combined with the remaining write data bits corresponding to the remaining bit positions of the write group. The redundant column of the I/O data uses the write mask bit assigned to a neighbor write group. No selection logic is used for the bit position corresponding to the redundant column.

In an embodiment, block 440 includes combiners, which combines write data and write mask data based on selections performed by the redundancy logic. In some embodiments, the combiners combine write data and write mask data with Boolean AND logic on a bit-wide basis. The output values of the combiners are sent to write drivers, which send enabled write information to write columns 430A or write columns 430B based on which one of the arrays 410A-410B is being accessed. In some embodiments, block 440 uses dynamic logic, a write clock signal and timing control logic for setting up the write data drivers.

Column decoders may be placed in blocks 430A-430B or another block. Row decoders may be placed in blocks (not shown) above or below arrays 410A-410B. Row decoders select the row, or the memory line, to be accessed based on the received request address. Write data is driven from block 430A into array 410A and written into a portion of the selected row. Similarly, write data may be driven from block 430B into array 410B and written into a portion of the selected row. In various embodiments, the column decoders select the portion being accessed in the selected row. As described earlier, the number of bits stored in each row in arrays 410A-410B may be larger than the number of bits of the I/O data. Selection logic within arrays 410A-410B specify the portion with the selected row. For read access requests, blocks 420A-420B are used to precharge the read lines routed to the arrays 410A-410B. Read latches and timing logic used for precharging and setting up sense amplifiers and read word line driver logic may be placed in blocks 420A-420B or another block.

Figure 5:
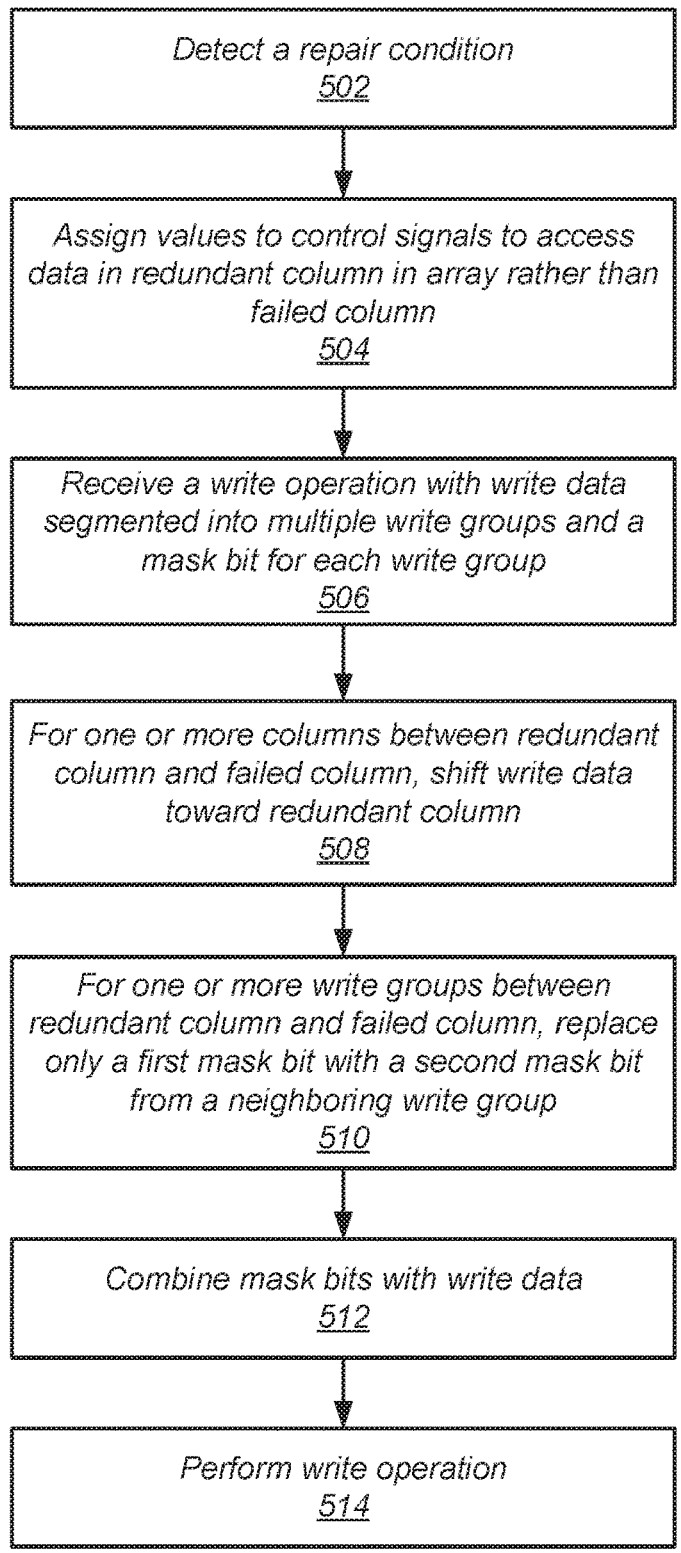
FIG. 5 is a flow diagram of one embodiment of a method for efficiently increasing reliability of memory accesses.

Referring now to FIG. 5, a generalized flow diagram of one embodiment of a method 500 for efficiently increasing reliability of memory accesses is shown. For purposes of discussion, the steps in this embodiment (as well as for FIG. 6) are shown in sequential order. However, in other embodiments some steps may occur in a different order than shown, some steps may be performed concurrently, some steps may be combined with other steps, and some steps may be absent.

A repair condition is detected (block 502). Values are assigned to control signals to access data in a redundant column in an array rather than access a failed column (block 504). A write operation is received with write data segmented into multiple write groups and a mask bit for each write group (block 506). For write data targeting one or more columns between the redundant column and the failed column, the write data is shifted toward the redundant column (block 508).

In some embodiments, the write data is shifted toward the redundant column for each of the columns between the redundant column and the failed column. In some embodiments, for a given write group between the redundant column and the failed column, only a single mask bit, rather than each mask bit, assigned to the given write group is replaced with a mask bit from a neighbor write group (block 510). In an embodiment, for each write group between the redundant column and the failed column, only a single mask bit assigned to a given write group is replaced with a mask bit from a neighbor write group without replacing the other mask bits assigned to the given write group. Mask bits are combined with write data (block 512). The write operation is performed (block 514).

Figure 6:
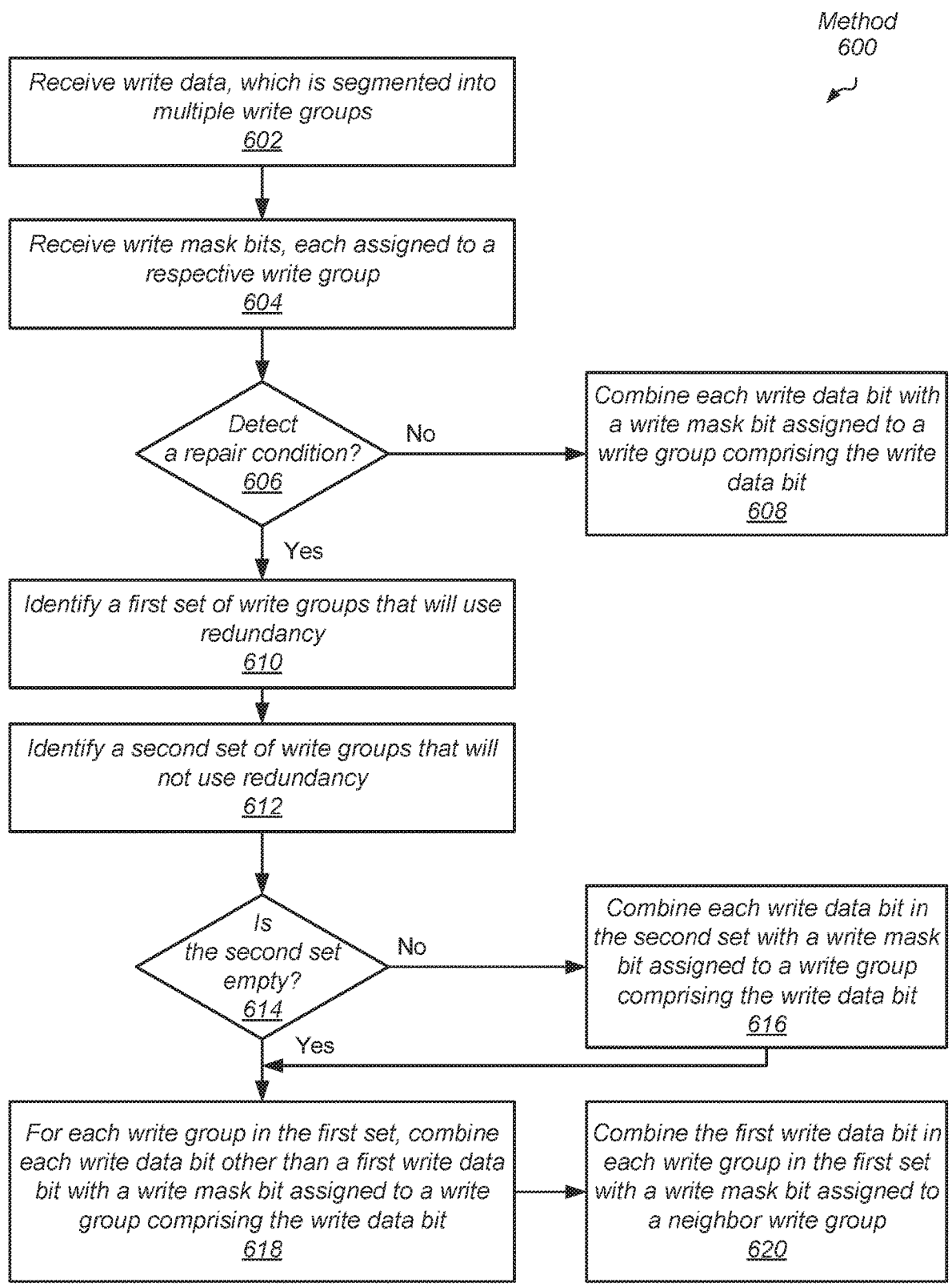
FIG. 6 is a flow diagram of another embodiment of a method for efficiently increasing reliability of memory accesses.

Referring now to FIG. 6, a generalized flow diagram of another embodiment of a method 600 for efficiently increasing reliability of memory accesses is shown. Write data, which is segmented into multiple write groups, are received (block 602). Write mask bits, each assigned to a respective write group, are received (block 604). If a repair condition is not detected ("no" branch of the conditional block 606), then each write data bit is combined with a write mask bit assigned to a write group comprising the write bit (block 608).

If a repair condition is detected ("yes" branch of the conditional block 606), then a first set of write groups that will use redundancy is identified (block 610). A second set of write groups that will not use redundancy is identified (block 612). If the second set is not empty ("no" branch of the conditional block 614), then each write data bit in the second set is combined with a write mask bit assigned to a write group comprising the write data bit (block 616). Control flow of method 600 then moves to block 618. Similarly, control flow of method 600 moves to block 618 if the second set is empty ("yes" branch of the conditional block 614). In block 618, each write data bit in the first set other than a first write data bit in each write group in the first set is combined with a write mask bit assigned to a write group comprising the write data bit. The first write data bit in each write group in the first set is combined with a write mask bit assigned to a neighbor write group (block 620). In various embodiments, a write operation is performed upon the completion of method 600. For example, a write operation can be performed after each of blocks 608, 616 and 620. As described earlier, the write mask bits are used as an equivalent of a write enable signal. Therefore, based on the values of particular write mask bits, in some embodiments, one or more write groups have the write operation disabled while one or more write groups have the write operation enabled.

Turning next to FIG. 7, a block diagram of one embodiment of a system 700 is shown. As shown, system 700 may represent chip, circuitry, components, etc., of a desktop computer 710, laptop computer 720, tablet computer 730, cell or mobile phone 740, television 750 (or set top box configured to be coupled to a television), wrist watch or other wearable item 760, or otherwise. Other devices are possible and are contemplated. In the illustrated embodiment, the system 700 includes at least one instance of processor 708 which includes a processor portion and embedded memory, such as memory 100 (of FIG. 1) or memory 400 (of FIG. 4). As described earlier, the embedded memory may use redundancy logic, such as logic within redundancy block 200 (of FIG. 2) and redundancy block 300 (of FIG. 3). In an embodiment, processor 708 is coupled to an external memory 702. In various embodiments, processor 708 with embedded memory may be included within a system on chip (SoC) or integrated circuit (IC) which is coupled to external memory 702, peripherals 704, and power supply 706.

Processor 708 is coupled to one or more peripherals 704 and the external memory 702. A power supply 706 is also provided which supplies the supply voltages to processor 708 as well as one or more supply voltages to the memory 702 and/or the peripherals 704. In various embodiments, power supply 706 may represent a battery (e.g., a rechargeable battery in a smart phone, laptop or tablet computer). In some embodiments, more than one instance of processor 708 may be included (and more than one external memory 702 may be included as well).

The memory 702 may be any type of memory, such as dynamic random access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices may be coupled onto a circuit board to form memory modules such as single inline memory modules (SIMMs), dual inline memory modules (DIMMs), etc. Alternatively, the devices may be mounted with an SoC or IC containing processor 100 in a chip-on-chip configuration, a package-on-package configuration, or a multi-chip module configuration.

The peripherals 704 may include any desired circuitry, depending on the type of system 700. For example, in one embodiment, peripherals 704 may include devices for various types of wireless communication, such as Wi-Fi, Bluetooth, cellular, global positioning system, etc. The peripherals 704 may also include additional storage, including RAM storage, solid state storage, or disk storage. The peripherals 704 may include user interface devices such as a display screen, including touch display screens or multi-touch display screens, keyboard or other input devices, microphones, speakers, etc.

In various embodiments, program instructions of a software application may be used to implement the methods and/or mechanisms previously described. The program instructions may describe the behavior of hardware in a high-level programming language, such as C. Alternatively, a hardware design language (HDL) may be used, such as Verilog. The program instructions may be stored on a non-transitory computer readable storage medium. Numerous types of storage media are available. The storage medium may be accessible by a computer during use to provide the program instructions and accompanying data to the computer for program execution. In some embodiments, a synthesis tool reads the program instructions in order to produce a netlist comprising a list of gates from a synthesis library.

It should be emphasized that the above-described embodiments are only non-limiting examples of implementations. Numerous variations and modifications will become apparent to those skilled in the art once the above disclosure is fully appreciated. It is intended that the following claims be interpreted to embrace all such variations and modifications.

What is claimed is:

1. An apparatus comprising:
one or more interfaces configured to:
receive write data segmented into a plurality of write groups;
receive a plurality of mask bits, each mask bit assigned to a respective write group of the plurality of write groups; and
circuitry, wherein in response to receiving a write operation comprising write data that targets a failed column in the memory array:
for data bits of the write data targeting columns between a redundant column and the failed column, shift the data bits toward the redundant column; and
for a first write group of the write data targeting columns between the redundant column and the failed column, replace only a first mask bit assigned to the first write group with a second mask bit assigned to a second write group without replacing other mask bits assigned to the first write group; and
write data in columns of the memory array other than the targeted failed column, wherein values of the data are based at least in part on the write data.

2. The apparatus as recited in claim 1, wherein the circuitry is further configured to assign the first mask bit assigned to the first write group to each write bit other than the first write bit in the first write group regardless of whether it is determined there is a failed column in the array.

3. The apparatus as recited in claim 1, wherein the circuitry is further configured to generate output values by combining each write bit in the first write group with the first mask bit assigned to the first write group.

4. The apparatus as recited in claim 3, wherein to complete the write operation, the circuitry is further configured to send the generated output values to the array via the one or more interfaces.

5. The apparatus as recited in claim 1, wherein when a redundant column in the array is placed next to columns of the array corresponding to a least significant write group of the plurality of write groups, the first write bit is a most significant bit of the first write group.

6. The apparatus as recited in claim 1, wherein when a redundant column in the array is placed next to columns of the array corresponding to a most significant write group of the plurality of write groups, the first write bit is a least significant bit of the first write group.

7. The apparatus as recited in claim 6, wherein the second write group is both a write group neighboring the first write group and a less significant write group than the first write group.

8. The apparatus as recited in claim 6, wherein a the circuitry is further configured to combine an assigned mask bit to each write bit in a least significant write group of the plurality of write groups regardless of whether it is determined there is a failed column in the array.

9. The apparatus as recited in claim 6, wherein a write bit of a most significant write group of the plurality of write groups corresponding to the redundant column is combined with a mask bit assigned to the most significant write group regardless of whether it is determined there is a failed column in the array.

10. A method for increasing reliability of memory accesses, comprising:
receiving write data segmented into a plurality of write groups;
receiving a plurality of mask bits, each mask bit assigned to a respective write group; and
sending control signals to an array comprising a plurality of columns;
in response to determining there is a failed column in the array:
setting the control signals to indicate a redundant column is to be accessed rather than the failed column in the array;
in response to receiving a write operation comprising write data:
for data bits of the write data targeting columns between the redundant column and the failed column, shifting the data bits toward the redundant column;
for a first write group of the write data targeting columns between the redundant column and the failed column, replacing only a first mask bit assigned to the first write group with a second mask bit assigned to a second write group without replacing other mask bits assigned to the first write group; and writing data in columns of the memory array other than the targeted failed column, wherein values of the data are based at least in part on the write data.

11. The method as recited in claim 10, further comprising assigning the first mask bit assigned to the first write group to each write bit other than the first write bit in the first write group regardless of whether it is determined there is a failed column in the array.

12. The method as recited in claim 10, further comprising generating output values by combining each write bit in the first write group with the first mask bit assigned to the first write group.

13. The method as recited in claim 12, wherein to complete the write operation, the method further comprises sending the generated output values to the array via the one or more interfaces.

14. The method as recited in claim 10, wherein when a redundant column in the array is placed next to columns of the array corresponding to a least significant write group of the plurality of write groups, the first write bit is a most significant bit of the first write group.

15. The method as recited in claim 10, wherein when a redundant column in the array is placed next to columns of the array corresponding to a most significant write group of the plurality of write groups, the first write bit is a least significant bit of the first write group.

16. The method as recited in claim 15, wherein the second write group is both a write group neighboring the first write group and a less significant write group than the first write group.

17. A memory comprising:
   one or more arrays, each comprising a plurality of columns and configured to store data;
   a plurality of sequential elements for storing write data segmented into a plurality of write groups and a plurality of mask bits, each mask bit assigned to a respective write group; and
   redundancy logic configured to:
      send control signals to the one or more arrays;
      in response to determining there is a failed column in the array, the circuitry is configured to:
         set the control signals to indicate a redundant column is to be accessed rather than the failed column in the array;
      in response to receiving a write operation comprising write data:
         for data bits of the write data targeting columns between the redundant column and the failed column, shift the data bits toward the redundant column;
         for a first write group of the write data targeting columns between the redundant column and the failed column, replace only a first mask bit assigned to the first write group with a second mask bit assigned to a second write group without replacing other mask bits assigned to the first write group; and
         write data in columns of the memory array other than the targeted failed column, wherein values of the data are based at least in part on the write data.

18. The memory as recited in claim 17, wherein the redundancy logic is further configured to assign the first mask bit assigned to the first write group to each write bit other than the first write bit in the first write group regardless of whether it is determined there is a failed column in the array.

19. The memory as recited in claim 17, wherein the redundancy logic is further configured to generate output values by combining each write bit in the first write group with the first mask bit assigned to the first write group.

20. The memory as recited in claim 17, wherein when a redundant column in the array is placed next to columns of the array corresponding to a least significant write group of the plurality of write groups, the first write bit is a most significant bit of the first write group.

* * * * *